(12) United States Patent
Li et al.

(10) Patent No.: US 12,345,336 B1
(45) Date of Patent: Jul. 1, 2025

(54) PISTON RING WITH HARD PLATING, AND PREPARATION METHOD THEREFOR

(71) Applicant: Asimco Shuanghuan Piston Ring (yizheng) Co., Ltd., Yizheng (CN)

(72) Inventors: Kaishun Li, Yizheng (CN); Qianxi Liu, Yizheng (CN); Yueting Zhou, Yizheng (CN); Guanfei Shi, Yizheng (CN)

(73) Assignee: Asimco Shuanghuan Piston Ring (yizheng) Co., Ltd., Yizheng (CN)

( * ) Notice: Subject to any disclaimer, the term of this patent is extended or adjusted under 35 U.S.C. 154(b) by 0 days.

(21) Appl. No.: 18/625,273

(22) Filed: Apr. 3, 2024

(30) Foreign Application Priority Data

Jan. 2, 2024 (CN) .......................... 202410000422.2

(51) Int. Cl.
*F16J 9/26* (2006.01)
*C23C 14/00* (2006.01)
(Continued)

(52) U.S. Cl.
CPC ............. *F16J 9/26* (2013.01); *C23C 14/0084* (2013.01); *C23C 14/0605* (2013.01);
(Continued)

(58) Field of Classification Search
None
See application file for complete search history.

(56) References Cited

U.S. PATENT DOCUMENTS

| 2008/0166287 | A1* | 7/2008 | Venkatraman | ........ C23C 28/322 423/446 |
| 2014/0257494 | A1* | 9/2014 | Thorwarth | ............ A61L 27/045 623/18.11 |

(Continued)

FOREIGN PATENT DOCUMENTS

| CN | 201818384 | U | * | 5/2011 | ......... C23C 14/0605 |
| CN | 102092166 | A | | 6/2011 | |

(Continued)

OTHER PUBLICATIONS

Translation of—CN-109372651-A; Cheng et al—from Apr. 25, 2024 IDS (Year: 2019).*

(Continued)

*Primary Examiner* — Seth Dumbris
(74) *Attorney, Agent, or Firm* — Bayramoglu Law Offices LLC

(57) ABSTRACT

A piston ring with a hard plating and a preparation method therefor are provided. An OD surface of the piston ring includes an interlayer, a gradient metal nitride layer and a DLC repetitive unit layer sequentially from bottom to top; one DLC unit layer in the DLC repetitive unit layer sequentially includes a DLC layer and a metal-doped DLC layer; and chrome plating of a side face of the piston ring is a chrome plating on a side face of a piston ring matrix. The repetitively circulating DLC layers and metal-doped DLC layers are a combination of a micron-thickness layer and a nanometer-thickness layer to form a micro-nano layered structure, so that the binding force between each plating is (Continued)

enhanced and the internal stress of the plating is reduced; and meanwhile, metal doping in the DLC layer can effectively reduce the plating stress and solve the problem of plating peeling.

1 Claim, 1 Drawing Sheet

(51) Int. Cl.
*C23C 14/06* (2006.01)
*C23C 14/16* (2006.01)
*C23C 14/34* (2006.01)
*C25D 3/06* (2006.01)
*C25D 3/10* (2006.01)
*C25D 5/18* (2006.01)
*C25D 7/04* (2006.01)

(52) U.S. Cl.
CPC ........ *C23C 14/0641* (2013.01); *C23C 14/165* (2013.01); *C23C 14/345* (2013.01); *C23C 14/3464* (2013.01); *C25D 3/06* (2013.01); *C25D 3/10* (2013.01); *C25D 5/18* (2013.01); *C25D 7/04* (2013.01)

(56) References Cited

U.S. PATENT DOCUMENTS

| | | | |
|---|---|---|---|
| 2015/0018254 A1* | 1/2015 | Araujo | .................... C23C 28/42 508/105 |
| 2020/0040477 A1 | 2/2020 | Nawafune et al. | |

FOREIGN PATENT DOCUMENTS

| | | | | |
|---|---|---|---|---|
| CN | 103510046 A | | 1/2014 | |
| CN | 109372651 A | * | 2/2019 | ......... C23C 14/0605 |
| CN | 111133235 A | | 5/2020 | |
| CN | 109372651 B | | 6/2021 | |
| CN | 115233281 A | | 10/2022 | |
| CN | 115803479 A | | 3/2023 | |
| ES | 2790683 T3 | * | 10/2020 | ........... F16J 15/3272 |
| JP | H05231543 A | | 9/1993 | |

OTHER PUBLICATIONS

Translation of—CN-201818384-U—Cheng et al (Year: 2011).*
Translation—ES-2790683-T3, Kvistgaard P A; Oct. 28, 2020 (Year: 2020).*

* cited by examiner

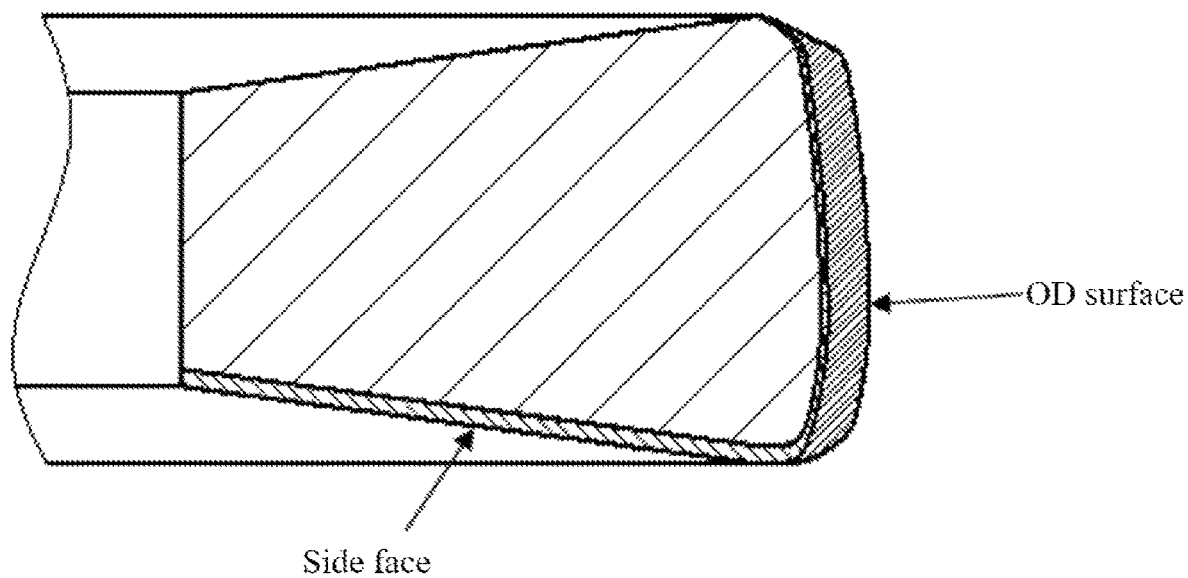

PISTON RING WITH HARD PLATING, AND PREPARATION METHOD THEREFOR

CROSS REFERENCE TO THE RELATED APPLICATIONS

This application is based upon and claims priority to Chinese Patent Application No. 202410000422.2, filed on Jan. 2, 2024, the entire contents of which are incorporated herein by reference.

TECHNICAL FIELD

The present invention relates to the technical field of piston ring surface treatment, and in particular to a piston ring with hard plating, and a preparation method therefor.

BACKGROUND

A piston ring, as a core part of an engine, seals fuel gas together with an air cylinder, a piston and an air cylinder wall. Early piston rings were formed by casting. With the technological progress, high-power steel piston rings were born. With the continuous improvement of engine functions and environmental requirements, various advanced surface treatments are applied to the piston rings, for example, thermal spraying, electroplating, chrome plating, gas nitriding, physical deposition, surface coating and zinc-manganese phosphating, so that the functions of the piston rings are greatly improved.

At present, as the requirements of low-carbon missions are becoming more and more strict, improving the fuel utilization range of engines is the key to meet the low-carbon missions. It is found through research that arranging a diamond-like carbon (DLC) plating with a low friction coefficient on an outer diameter (OD) surface of the piston ring can effectively reduce friction consumption and increase the energy conversion rate of the engine, so arranging the DLC plating on the OD surface of the piston ring is the research focus of piston ring surface treatment at present. The structure of the DLC plating is between diamond and graphite, is an amorphous metastable structure, has high hardness, high elastic modulus, low friction, high wear resistance and high thermal conductivity, and can meet the friction performance requirement of the piston ring.

An existing preparation method for the DLC plating is usually a vapor deposition method. For example, the patent CN111133235A discloses a piston ring. An OD surface of the piston ring is a DLC layer which is formed by a physical vapor deposition (PVD) process; however, a thickness of the DLC layer and the related friction performance data are not disclosed in this technology. It is found through research that the DLC plating will generate a high residual stress in the deposition process, the larger the thickness of the DLC plating, the higher the stress, which will easily reduce the binding strength between the DLC plating and a matrix, resulting in the peeling of the DLC plating. This seriously limits the performance improvement of the piston ring. Therefore, the improvement of a surface treatment process of the piston ring is an urgent problem to be solved at present.

SUMMARY

An objective of the present invention is to provide a piston ring with hard plating, and a preparation method therefor, thereby solving the problems that a surface plating of a piston ring prepared by the prior art is easy to peel off and the friction performance is limited.

To achieve the above objective of the present invention, the present invention provides the following technical solution:

the present invention provides a piston ring with hard plating, where an OD surface and a side face of the piston ring respectively have hard plating;

the hard plating of the OD surface of the piston ring sequentially includes an interlayer, a gradient metal nitride layer and a DLC repetitive unit layer sequentially from bottom to top on the OD surface of a piston ring matrix;

one DLC unit layer in the DLC repetitive unit layer includes a DLC layer and a metal-doped DLC layer sequentially from bottom to top; the number of repetitions of the DLC unit layers is 2 to 10; and the hard plating of the side face of the piston ring is a chrome plating on the side face of a piston ring matrix.

Preferably, in the piston ring with hard plating, the interlayer is a chrome layer; the gradient metal nitride layer is a gradient titanium nitride layer; and the metal-doped DLC layer is a titanium-doped DLC layer.

Preferably, in the piston ring with hard plating, a thickness of the interlayer is 1 μm to 4μ m.

Preferably, in the piston ring with hard plating, a thickness of the gradient metal nitride layer is 0.1 μm to 2 μm.

Preferably, in the piston ring with hard plating, a thickness of the DLC layer in the one DLC unit layer is 1 μm to 10 μm; and a thickness of the metal-doped DLC layer in the one DLC unit layer is 50 nm to 500 nm.

Preferably, in the piston ring with hard plating, a total thickness of the DLC repetitive unit layer is 20 μm to 40 μm.

Preferably, in the piston ring with hard plating, a thickness of the chrome plating is 1 μm to 20 μm.

The present invention further provides a preparation method for a piston ring with hard plating, including the following steps:

(1) placing the piston ring matrix in a PVD device, introducing argon, opening a chrome target material, depositing the interlayer on the OD surface of the piston ring matrix, then closing the chrome target material, opening a titanium target material, introducing nitrogen, gradually increasing the flow rate of the nitrogen, and depositing the gradient metal nitride layer on the interlayer;

(2) stopping the introducing of the nitrogen, closing the titanium target material, opening a graphite target material, depositing the DLC layer on the gradient metal nitride layer, then opening the titanium target material, and depositing the metal-doped DLC layer on the DLC layer;

(3) repeating Step (2) to obtain the DLC repetitive unit layer, that is, obtain the piston ring with the hard plating of the OD surface; and (4) placing the piston ring with the hard plating of the OD surface in an electroplating apparatus, electroplating the side face by using electroplating liquid to obtain the chrome plating, that is, obtain the piston ring with the hard plating.

Preferably, in the preparation method for the piston ring with hard plating, the conditions of depositing the interlayer in Step (1) are: the flow rate of the argon is 100 sccm to 300 sccm, the vacuum degree is $1\times10^{-3}$ Pa to $5\times10^{-3}$ Pa, the negative bias is −10 V to −30 V, the cathode current of the chrome target material is 40 A to 70 A, and the deposition time is 30 min to 60 min;

the conditions of depositing the gradient metal nitride layer in Step (1) are: the flow rate of the argon is 50 sccm to 60 sccm, the flow rate of the nitrogen is increased from 0 sccm to 100 sccm to 150 sccm at a speed of 5 sccm/min to 20 sccm/min, the vacuum degree is $1\times10^{-3}$ Pa to $5\times10^{-3}$ Pa, the negative bias is −20 V to −40 V, the cathode current of the titanium target material is 50 A to 100 A, and the deposition time is 5 min to 30 min;

the conditions of depositing the DLC layer in Step (2) are: the flow rate of the argon is 200 sccm to 300 sccm, the vacuum degree is $2\times10^{-3}$ Pa to $5\times10^{-3}$ Pa, the negative bias is −50 V to −80 V, the cathode current of the graphite target material is 80 A to 200 A, and the deposition time is 10 min to 30 min; and the conditions of depositing the metal-doped DLC layer in Step (2) are: the flow rate of the argon is 200 sccm to 300 sccm, the vacuum degree is $2\times10^{-3}$ Pa to $5\times10^{-3}$ Pa, the negative bias is −50 V to −80 V, the cathode current of the graphite target material is 80 A to 200 A, the cathode current of the titanium target material is 50 A to 70 A, and the deposition time is 1 min to 5 min.

Preferably, in the preparation method for the piston ring with hard plating, the electroplating liquid in Step (4) includes: chromium sulfate of 20-40 g/L, sulfuric acid of 5-15 g/L, citric acid of 1-7 g/L, glycerol of 1-5 mL/L, sodium dodecyl sulfate of 1-8 g/L and aluminium oxide of 10-20 g/L; and the electroplating conditions in Step (4) are: flash plating is performed for 5 s to 20 s at a current density of 350 A/dm² to 400 A/dm² firstly, and then electroplating is performed for 2 min to 10 min at a current density of 100 A/dm² to 200 A/dm².

According to the above technical solution, compared with the prior art, the present invention has the following beneficial effects:

(1) the hard plating of the OD surface of the piston ring according to the present invention sequentially includes the interlayer, the gradient metal nitride layer, the repetitively circulating DLC layer and the metal-doped DLC layer, where the nitrogen content of the gradient metal nitride layer is gradually increased, so that the hardness of the metal nitride layer can be gradually increased, a gradually increased hardness gradient is formed from the interlayer to the DLC layer, and the problem that the plating is prone to peel off due to the greatly increased hardness is relieved. Furthermore, the repetitively circulating DLC layer and metal-doped DLC layer are a combination of a micron-thickness layer and a nanometer-thickness layer to form a micro-nano layered structure, so that the binding force between each plating is enhanced and the internal stress of the plating is reduced; meanwhile, metal doping in the DLC layer can effectively reduce the plating stress and solve the problem of plating peeling. The overall thickness of the OD surface plating according to the present invention can reach 40 μm, the hardness of the plating is greater than 1500 HV, the friction coefficient is less than 0.12, and the characteristics of excellent low friction, high wear resistance and high cylinder scuffing resistance are achieved.

(2) According to the present invention, the composite DLC plating is deposited on the OD surface of the piston ring by the physical vapor deposition method, and the chrome plating is deposited on the side face of the piston ring by the electroplating method, so the hard plating is formed on the OD surface and the side face of the piston ring, and the service life of the piston ring is prolonged.

BRIEF DESCRIPTION OF THE DRAWINGS

To more clearly illustrate the embodiments of the present invention or the technical solutions in the prior art, the accompanying drawings needing to be used in the description of the embodiments or the prior art will be briefly described below.

FIGURE is a schematic sectional view of a piston ring according to the present invention.

DETAILED DESCRIPTION OF THE EMBODIMENTS

The present invention provides a piston ring with hard plating, where an OD surface and a side face of the piston ring respectively have hard plating;

the hard plating of the OD surface of the piston ring sequentially includes an interlayer, a gradient metal nitride layer and a DLC repetitive unit layer sequentially from bottom to top on the OD surface of a piston ring matrix; and one DLC unit layer in the DLC repetitive unit layer includes a DLC layer and a metal-doped DLC layer sequentially from bottom to top.

In the present invention, the number of repetitions of the DLC unit layers is 2 to 10, further preferably, 3 to 7, and more preferably, 4 to 5. A method for calculating the number of repetitions according to the present invention is: after the first deposition of the DLC unit layer, the second deposition of the DLC unit layer is denoted as one repetition, the third deposition of the DLC unit layer is denoted as two repetitions, and so on.

In the present invention, the interlayer is preferably a chrome layer; the gradient metal nitride layer is preferably a gradient titanium nitride layer; and the metal-doped DLC layer is preferably a titanium-doped DLC layer.

In the present invention, a thickness of the interlayer is preferably is 1 μm to 4 μm, further preferably, 2 μm to 3 μm, and more preferably, 2 μm.

In the present invention, a thickness of the gradient metal nitride layer is preferably 0.1 μm to 2 μm, further preferably, 0.3 μm to 1.6 μm, and more preferably, 0.5 μm to 1 μm.

In the present invention, a thickness of the DLC layer in the one DLC unit layer is preferably 1 μm to 10 μm, further preferably, 2 μm to 8 μm, and more preferably, 7 μm; and a thickness of the metal-doped DLC layer in the one DLC unit layer is preferably 50 nm to 500 nm, further preferably, 100 nm to 400 nm, and more preferably, 300 nm.

In the present invention, a total thickness of the DLC repetitive unit layer is preferably 20 μm to 40 μm, further preferably, 25 μm to 37 μm, and more preferably, 31 μm.

In the present invention, the hard plating of the side face of the piston ring is a chrome plating on the side face of a piston ring matrix.

In the present invention, a thickness of the chrome plating is preferably is 1 μm to 20 μm, further preferably, 4 μm to 15 μm, and more preferably, 12 μm.

In the present invention, a matrix of the piston ring is preferably made of steel or cast iron.

The present invention further provides a preparation method for a piston ring with hard plating, including the following steps:

(1) the piston ring matrix was placed in a PVD device, argon was introduced, a chrome target material was opened, the interlayer was deposited on the OD surface of the piston ring matrix, then the chrome target material was closed, a titanium target material was opened, nitrogen was introduced, the flow rate of the nitrogen was gradually increased, and the gradient metal nitride layer was deposited on the interlayer;

(2) the introducing of the nitrogen was stopped, the titanium target material was closed, a graphite target material was opened, the DLC layer was deposited on the gradient metal nitride layer, then the titanium target material was opened, and the metal-doped DLC layer was deposited on the DLC layer;

(3) Step (2) was repeated to obtain the DLC repetitive unit layer, that is, obtain the piston ring with the hard plating of the OD surface; and (4) the piston ring with the hard plating of the OD surface was placed in an electroplating apparatus, the side face was electroplated by using electroplating liquid to obtain the chrome plating, that is, obtain the piston ring with the hard plating.

In the present invention, the PVD device in Step (1) is a conventional device in this field and is only required to have a vacuum arc ion plating deposition function, which is not limited in the present invention.

In the present invention, pretreatment is further included before the use of the piston ring matrix in Step (1). The pretreatment includes the following steps: the piston ring matrix was respectively cleaned sequentially with acetone and anhydrous ethanol for three times and then was placed in the PVD device, the vacuum degree was set to $5\times10^{-3}$ Pa, argon with the flow rate of 50 sccm was introduced, the negative bias of the piston ring matrix was set to $-800$ V, and etching and cleaning were performed for 50 min.

In the present invention, the conditions of depositing the interlayer in Step (1) are: the flow rate of the argon is preferably 100 sccm to 300 sccm, further preferably, 130 sccm to 260 sccm, and more preferably, 200 sccm; the vacuum degree is preferably $1\times10^{-3}$ Pa to $5\times10^{-3}$ Pa, further preferably, $2\times10^{-3}$ Pa to $5\times10^{-3}$ Pa, and more preferably, $5\times10^{-3}$ Pa; the negative bias is preferably $-10$ V to $-30$ V, further preferably, $-12$ V to $-25$ V, and more preferably, $-22$ V; the cathode current of the chrome target material is preferably 40 A to 70 A, further preferably, 44 A to 65 A, and more preferably, 50 A; and the deposition time is preferably 30 min to 60 min, further preferably, 30 min to 50 min, and more preferably, 40 min.

In the present invention, the conditions of depositing the gradient metal nitride layer in Step (1) are: the flow rate of the argon is preferably 50 sccm to 60 sccm, further preferably, 52 sccm to 58 sccm, and more preferably, 55 sccm; the flow rate of the nitrogen is preferably increased from 0 sccm to 100 sccm to 150 sccm at a speed of 5 sccm/min to 20 sccm/min, further preferably, from 0 sccm to 120 sccm to 150 sccm at a speed of 7 sccm/min to 16 sccm/min, and more preferably, from 0 sccm to 150 sccm at a speed of 10 sccm/min; the vacuum degree is preferably $1\times10^{-3}$ Pa to $5\times10^{-3}$ Pa, further preferably, $3\times10^{-3}$ Pa to $5\times10^{-3}$ Pa, and more preferably, $5\times10^{-3}$ Pa; the negative bias is preferably, $-20$ V to $-40$ V, further preferably, $-25$ V to $-35$ V, and more preferably, $-30$ V; the cathode current of the titanium target material is preferably 50 A to 100 A, further preferably, 60 A to 90 A, and more preferably, 80 A; and the deposition time is preferably 5 min to 30 min, further preferably, 10 min to 20 min, and more preferably, 15 min.

In the present invention, the conditions of depositing the DLC layer in Step (2) are: the flow rate of the argon is preferably 200 sccm to 300 sccm, further preferably, 250 sccm to 300 sccm, and more preferably, 300 sccm; the vacuum degree is preferably $2\times10^{-3}$ Pa to $5\times10^{-3}$ Pa, further preferably, $4\times10^{-3}$ Pa to $5\times10^{-3}$ Pa, and more preferably, $5\times10^{-3}$ Pa; the negative bias is preferably $-50$ V to $-80$ V, further preferably, $-60$ V to $-80$ V, and more preferably, $-70$ V; the cathode current of the graphite target material is preferably 80 A to 200 A, further preferably, 90 A to 160 A, and more preferably, 120 A; and the deposition time is preferably 10 min to 30 min, further preferably, 12 min to 25 min, and more preferably, 20 min.

In the present invention, the conditions of depositing the metal-doped DLC layer in Step (2) are: the flow rate of the argon is preferably 200 sccm to 300 sccm, further preferably, 250 sccm to 300 sccm, and more preferably, 300 sccm; the vacuum degree is preferably $1\times10^{-3}$ Pa to $5\times10^{-3}$ Pa, further preferably, $4\times10^{-3}$ Pa to $5\times10^{-3}$ Pa, and more preferably, $5\times10^{-3}$ Pa; the negative bias is preferably $-50$ V to $-80$ V, further preferably, $-60$ V to $-80$ V, and more preferably, $-80$ V; the cathode current of the graphite target material is preferably 80 A to 200 A, further preferably, 90 A to 160 A, and more preferably, 120 A; the cathode current of the titanium target material is preferably 50 A to 70 A, further preferably, 54 A to 60 A, and more preferably, 55 A; and the deposition time is preferably 1 min to 5 min, further preferably, 2 min to 5 min, and more preferably, 4.5 min.

In the present invention, the electroplating apparatus in Step (4) is a clamp for side face electroplating of a piston ring according to the patent 202210805055.4, and a method for clamping the piston ring in the clamp is referenced to Step S1 in Embodiment 1 of the patent 202210805055.4.

In the present invention, the electroplating liquid in Step (4) includes: chromium sulfate of 20-40 g/L, sulfuric acid of 5-15 g/L, citric acid of 1-7 g/L, glycerol of 1-5 mL/L, sodium dodecyl sulfate of 1-8 g/L and aluminium oxide of 10-20 g/L.

In the present invention, the chromium sulfate is preferably 22-38 g/L, further preferably, 25-35 g/L, and more preferably, 32 g/L; the sulfuric acid is preferably 6-14 g/L, further preferably, 8-12 g/L, and more preferably, 10 g/L; the citric acid is preferably 2-7 g/L, further preferably, 3-6 g/L, and more preferably, 4 g/L; the glycerol is preferably 2-5 mL/L, further preferably, 3-4.5 mL/L, and more preferably, 4 mL/L; the sodium dodecyl sulfate is preferably 2-8 g/L, further preferably, 4-7 g/L, and more preferably, 6 g/L; and the aluminium oxide is preferably 12-17 g/L, further preferably, 14-16 g/L, and more preferably, 15 g/L.

In the present invention, the electroplating conditions in Step (4) are preferably as follows: flash plating is performed at 30° C. to 50° C. for 5 s to 20 s at a current density of 350-400 A/dm$^2$ firstly, and then electroplating is performed at 30° C. to 50° C. for 2 min to 10 min at a current density of 100 A/dm$^2$ to 200 A/dm$^2$. The electroplating conditions are further preferably as follows: flash plating is performed at 35° C. to 50° C. for 10 s to 20 s at a current density of 360 A/dm$^2$ to 400 A/dm$^2$ firstly, and then electroplating is performed at 35° C. to 50° C. for 4 min to 9 min at a current density of 120 A/dm$^2$ to 180 A/dm$^2$. The electroplating conditions are more preferably as follow: flash plating is performed at 40° C. for 14 s at a current density of 400 A/dm$^2$ firstly, and then electroplating is performed at 40° C. for 8 min at a current density of 150 A/dm$^2$.

The following clearly and completely describes the technical solutions in the embodiments of the present invention. Apparently, the described embodiments are merely some embodiments of the present invention rather than all of the embodiments. All other embodiments obtained by a person of ordinary skill in the art based on the embodiments of the present invention without creative efforts shall fall within the protection scope of the present invention.

Embodiment 1

This embodiment provides a piston ring with hard plating, specifically, a piston ring with hard plating of an OD surface and chrome plating of a side face; the OD surface DLC plating includes a chrome layer, a gradient titanium nitride layer and a DLC repetitive unit layer sequentially from bottom to top on an OD surface of a piston ring matrix; one DLC unit layer in the DLC repetitive unit layer includes a DLC layer and a titanium-doped DLC layer sequentially from bottom to top; the number of repetitions of the DLC unit layers is 4;

a thickness of the chrome layer is 2 μm; a thickness of the gradient titanium nitride layer is 1 μm; a thickness of the DLC layer in one DLC unit layer is 5 μm; a thickness of the titanium-doped DLC layer is 100 nm; a total thickness of the DLC repetitive unit layer is 25.5 μm; and the hard plating of the side face is a chrome plating on the side face of the piston ring matrix, with a thickness of 12 μm.

A preparation method for the piston ring with the OD surface DLC plating and the side face chrome plating includes the following steps:

(1) a steel piston ring matrix was respectively cleaned sequentially with acetone and anhydrous ethanol for three times and then was placed in the PVD device, a cavity of the PVD device was heated and vacuumized until the temperature was 100° C. and the vacuum degree was $5\times10^{-3}$ Pa, argon with the flow rate of 50 sccm was introduced, the negative bias of the piston ring matrix was set to −800 V, and etching and cleaning were performed for 50 min;

(2) then the flow rate of the argon was adjusted to 200 sccm, a chrome target material was opened, the cathode current of the chrome target material was set to 52 A, the negative bias was set to −15 V, and a chrome layer was deposited on the OD surface of the piston ring matrix for 30 min;

then the chrome target material was closed, the flow rate of the argon was adjusted to 50 sccm, nitrogen was introduced, a titanium target material was opened, the cathode current of the titanium target material was set to 60 A, the negative bias was set to −22 V, the flow rate of the nitrogen was increased from 0 sccm to 100 sccm at a speed of 10 sccm/min, and a gradient titanium nitride layer was deposited on an interlayer for 10 min;

(3) the introducing of the nitrogen was stopped, the titanium target material was closed, the flow rate of the argon was adjusted to 200 sccm, a graphite target material was opened, the cathode current of the graphite target material was set to 110 A, the negative bias was set to −60 V, a DLC layer was deposited on the gradient titanium nitride layer for 12 min, then the titanium target material was opened, the cathode current of the titanium target material was set to 50 A, and a titanium-doped DLC layer was deposited on the DLC layer for 2 min;

(4) Step (3) was repeated for 4 times to obtain the DLC repetitive unit layer, that is, obtain the piston ring with the OD surface DLC plating; and (5) the piston ring with the OD surface DLC plating was placed in an electroplating apparatus, electroplating liquid including chromium sulfate of 24 g/L, sulfuric acid of 10 g/L, citric acid of 2 g/L, glycerol of 4 mL/L, sodium dodecyl sulfate of 3 g/L and aluminium oxide of 14 g/L was added, flash plating was performed at 30° C. for 10 s at a current density of 350 A/dm$^2$, and then electroplating was performed at 30° C. for 6 min at a current density of 120 A/dm$^2$ to obtain chrome plating of a side face, that is, obtain the piston ring with the OD surface DLC plating and the side face chrome plating.

The piston ring prepared above was subjected to a hardness, friction coefficient and heat resistance test (the temperature was preserved at 350° C. for 2 h in a muffle furnace, and whether the plating peeled off was observed) and a surface roughness test.

In a case that the hardness of the OD surface DLC plating is 2060 HV, the friction coefficient is 0.11 and the surface roughness is RZ1.6, the plating does not peel off after the temperature is preserved at 350° C. for 2 h in the muffle furnace. The hardness of the end surface chrome plating is 948 HV.

Embodiment 2

This embodiment provides a piston ring with hard plating, specifically, a piston ring with hard plating of an OD surface and chrome plating of a side face; the OD surface DLC plating includes a chrome layer, a gradient titanium nitride layer and a DLC repetitive unit layer sequentially from bottom to top on an OD surface of a piston ring matrix; one DLC unit layer in the DLC repetitive unit layer includes a DLC layer and a titanium-doped DLC layer sequentially from bottom to top; the number of repetitions of the DLC unit layers is 4;

a thickness of the chrome layer is 3 μm; a thickness of the gradient titanium nitride layer is 2 μm; a thickness of the DLC layer in one DLC unit layer is 7 μm; a thickness of the titanium-doped DLC layer is 300 nm; a total thickness of the DLC repetitive unit layer is 36.5 μm; and the hard plating of the side face is a chrome plating on the side face of the piston ring matrix, with a thickness of 12 μm.

A preparation method for the piston ring with the OD surface DLC plating and the side face chrome plating is specifically referenced to Embodiment 1, with the difference in that: the cathode current of the chrome target material in Step (2) is set to 65 A, and the deposition time of the chrome layer is 43 min; the cathode current of the titanium target material in Step (2) is set to 50 A, the negative bias is set to −20 V, the flow rate of the nitrogen is increased from 0 sccm to 135 sccm at a speed of 5 sccm/min, and the deposition time of the gradient titanium nitride layer is 27 min; and the flow rate of the argon in Step (3) is 240 sccm, the cathode current of the graphite target material is set to 140 A, the negative bias is set to −70 V, the deposition time of the DLC layer is 16 min, the cathode current of the titanium target material is set to 58 A, and the deposition time of the titanium-doped DLC layer is 3.5 min.

The piston ring prepared above was subjected to a hardness, friction coefficient and heat resistance test (the temperature was preserved at 350° C. for 2 h in a muffle furnace, and whether the plating peeled off was observed) and a surface roughness test.

In a case that the hardness of the OD surface DLC plating is 2480 HV, the friction coefficient is 0.095 and the surface roughness is RZ1.4, the plating does not peel off after the temperature is preserved at 350° C. for 2 h in the muffle furnace. The hardness of the end surface chrome plating is 952 HV.

Embodiment 3

This embodiment provides a piston ring with hard plating, specifically, a piston ring with hard plating of an OD surface and chrome plating of a side face; the OD surface DLC plating includes a chrome layer, a gradient titanium nitride layer and a DLC repetitive unit layer sequentially from bottom to top on an OD surface of a piston ring matrix; one DLC unit layer in the DLC repetitive unit layer includes a DLC layer and a titanium-doped DLC layer sequentially from bottom to top; the number of repetitions of the DLC unit layers is 6;
- a thickness of the chrome layer is 3 μm; a thickness of the gradient titanium nitride layer is 2 μm; a thickness of the DLC layer in one DLC unit layer is 4 μm; a thickness of the titanium-doped DLC layer is 500 nm; a total thickness of the DLC repetitive unit layer is 31.5 μm; and
- the hard plating of the side face is a chrome plating on the side face of the piston ring matrix, with a thickness of 12 μm.

A preparation method for the piston ring with the OD surface DLC plating and the side face chrome plating is specifically referenced to Embodiment 2, with the difference in that: the cathode current of the graphite target material in Step (3) is set to 85 A, the negative bias is set to −50 V, the deposition time of the DLC layer is 15 min, the cathode current of the titanium target material is set to 70 A, the deposition time of the titanium-doped DLC layer is 4 min, and the number of repetitions in Step (4) is 6.

The piston ring prepared above was subjected to a hardness, friction coefficient and heat resistance test (the temperature was preserved at 350° C. for 2 h in a muffle furnace, and whether the plating peeled off was observed) and a surface roughness test.

In a case that the hardness of the OD surface DLC plating is 2290 HV, the friction coefficient is 0.10 and the surface roughness is RZ1.6, the plating does not peel off after the temperature is preserved at 350° C. for 2 h in the muffle furnace. The hardness of the end surface chrome plating is 955 HV.

Embodiment 4

This embodiment provides a piston ring with hard plating, specifically, a piston ring with hard plating of an OD surface and chrome plating of a side face; the OD surface DLC plating includes a chrome layer, a gradient titanium nitride layer and a DLC repetitive unit layer sequentially from bottom to top on an OD surface of a piston ring matrix; one DLC unit layer in the DLC repetitive unit layer includes a DLC layer and a titanium-doped DLC layer sequentially from bottom to top; the number of repetitions of the DLC unit layers is 3;
- a thickness of the chrome layer is 3 μm; a thickness of the gradient titanium nitride layer is 2 μm; a thickness of the DLC layer in one DLC unit layer is 8 μm; a thickness of the titanium-doped DLC layer is 420 nm; a total thickness of the DLC repetitive unit layer is 33.68 μm; and
- the hard plating of the side face is a chrome plating on the side face of the piston ring matrix, with a thickness of 18 μm.

A preparation method for the piston ring with the OD surface DLC plating and the side face chrome plating is specifically referenced to Embodiment 2, with the difference in that: the cathode current of the graphite target material in Step (3) is set to 180 A, the negative bias is set to −65 V, the deposition time of the DLC layer is 24 min, the cathode current of the titanium target material is set to 62 A, and the deposition time of the titanium-doped DLC layer is 4.5 min; the number of repetitions in Step (4) is 3; and in Step (5), flash plating is performed at 45° C. for 13 s at a current density of 400 A/dm$^2$, and then electroplating was performed at 45° C. for 8 min at a current density of 160 A/dm$^2$.

The piston ring prepared above was subjected to a hardness, friction coefficient and heat resistance test (the temperature was preserved at 350° C. for 2 h in a muffle furnace, and whether the plating peeled off was observed) and a surface roughness test.

In a case that the hardness of the OD surface DLC plating is 2340 HV, the friction coefficient is 0.099 and the surface roughness is RZ1.7, the plating does not peel off after the temperature is preserved at 350° C. for 2 h in the muffle furnace. The hardness of the end surface chrome plating is 962 HV.

Comparative Example 1

This comparative example provides a piston ring with hard plating, specifically, a piston ring with hard plating of an OD surface and chrome plating of a side face; the OD surface DLC plating includes a chrome layer, a gradient titanium nitride layer and a DLC layer sequentially from bottom to top on an OD surface of a piston ring matrix;
- a thickness of the chrome layer is 2 μm; a thickness of the gradient titanium nitride layer is 1 μm; a thickness of the DLC layer is 25.5 μm; and
- the hard plating of the side face is a chrome plating on the side face of the piston ring matrix, with a thickness of 12 μm.

A preparation method for the piston ring with the OD surface DLC plating and the side face chrome plating is specifically referenced to Embodiment 1, with the difference in that: the flow rate of the argon in Step (3) is 300 sccm, the cathode current of the graphite target material is set to 110 A, the negative bias is set to −80 V, the deposition time is 55 min, and Step (4) is not performed.

The piston ring prepared above was subjected to a hardness, friction coefficient and heat resistance test (the temperature was preserved at 350° C. for 2 h in a muffle furnace, and whether the plating peeled off was observed) and a surface roughness test.

In a case that the hardness of the OD surface DLC plating is 1780 HV, the friction coefficient is 0.13 and the surface roughness is RZ1.8, the plating peels off after the temperature is preserved at 350° C. for 2 h in the muffle furnace. The hardness of the end surface chrome plating is 945 HV.

The above are preferred embodiments of the present invention, and it should be noted that, for those of ordinary skill in the art, several improvements and modifications may be made without departing from the principle of the present invention, and the improvements and modifications are also regarded to be within the protection scope of the present invention.

What is claimed is:
1. A piston ring with a hard plating, wherein an outer diameter (OD) surface and a side face of the piston ring respectively have the hard plating;

the hard plating of the OD surface of the piston ring consists of an interlayer, a gradient metal nitride layer, and a diamond-like carbon (DLC) repetitive unit layer sequentially from bottom to top on an OD surface of a piston ring matrix;

one DLC unit layer in the DLC repetitive unit layer consists of a DLC layer and a metal-doped DLC layer sequentially from bottom to top; a number of repetitions of the DLC unit layer is 4 to 6;

the interlayer is a chrome layer; the gradient metal nitride layer is a gradient titanium nitride layer; the metal-doped DLC layer is a titanium-doped DLC layer;

a thickness of the interlayer is 1 μm to 4 μm;

a thickness of the gradient metal nitride layer is 0.1 μm to 2 μm;

a thickness of the DLC layer in the one DLC unit layer is 4 μm to 8 μm;

a thickness of the metal-doped DLC layer in the one DLC unit layer is 100 nm to 500 nm;

a total thickness of the DLC repetitive unit layer is 25.5 μm to 37 μm;

the hard plating of the side face of the piston ring is a chrome plating on a side face of the piston ring matrix; and a thickness of the chrome plating is 1 μm to 20 μm.

\* \* \* \* \*